(12) United States Patent
Snoeij et al.

(10) Patent No.: US 10,439,570 B2
(45) Date of Patent: Oct. 8, 2019

(54) SLEW BOOST DISABLE FOR AN OPERATIONAL AMPLIFIER

(71) Applicant: TEXAS INSTRUMENTS INCORPORATED, Dallas, TX (US)

(72) Inventors: Martijn Fridus Snoeij, Erding (DE); Steven Graham Brantley, Satellite Beach, FL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/848,700

(22) Filed: Dec. 20, 2017

(65) Prior Publication Data

US 2019/0190471 A1    Jun. 20, 2019

(51) Int. Cl.
*H03F 3/45*    (2006.01)
*H03F 3/16*    (2006.01)

(52) U.S. Cl.
CPC ......... *H03F 3/45089* (2013.01); *H03F 3/165* (2013.01); *H03F 3/45188* (2013.01); *H03F 3/45071* (2013.01); *H03F 3/45085* (2013.01); *H03F 3/45183* (2013.01); *H03F 2203/45061* (2013.01); *H03F 2203/45248* (2013.01)

(58) Field of Classification Search
CPC .. H03F 3/45089; H03F 3/45188; H03F 3/165; H03F 2203/45248; H03F 2203/45061; H03F 3/45085; H03F 1/3211; H03F 3/45071; H03F 3/45; H03F 3/45076; H03F 3/4508; H03F 2203/45138; H03F 3/45183; H03F 3/45179; H03F 3/45192; H03F 2200/177
USPC ........................................ 330/252, 253, 257
See application file for complete search history.

(56) References Cited

U.S. PATENT DOCUMENTS 6,437,645 B1 * 8/2002 Ivanov ................... H03F 3/3028
                                                              330/255
7,471,150 B2 * 12/2008 Alenin ....................... H03F 1/26
                                                              330/255
8,390,379 B2    3/2013 Snoeij et al.
9,054,657 B2 * 6/2015 Kumar ................. H03F 3/45179
2006/0220741 A1 * 10/2006 Jones .................. H03F 3/45192
                                                              330/253

* cited by examiner

*Primary Examiner* — Khanh V Nguyen
(74) *Attorney, Agent, or Firm* — John R. Pessetto; Charles A. Brill; Frank D. Cimino

(57) ABSTRACT

An operational amplifier includes an input stage configured to receive a first input voltage and a second input voltage and a slew boost circuit coupled to the input stage and configured to selectively increase current through the input stage. The operational amplifier also includes an output stage coupled to the input stage and configured to generate an output voltage, and a slew boost disable circuit configured to assert a control signal to the slew boost circuit to disable the slew boost circuit. The slew boost circuit is disabled when both: the first input voltage being more than a first threshold voltage different from the second input voltage and the output voltage failing to change by more than a second threshold rate.

20 Claims, 2 Drawing Sheets

SLEW BOOST DISABLE FOR AN OPERATIONAL AMPLIFIER

BACKGROUND

An operational amplifier is an amplifier that includes a differential input. At a steady state, the voltage on the input terminals of an operational amplifier are relatively the same. If one of the input terminals receives a sudden change in its voltage, due to capacitors internal to the operational amplifier, there will be a momentary period of time in which the input terminals experience different voltages. Eventually, however, the feedback associated with the circuit in which the operational amplifier is used causes the voltage on the input terminals again approximately match each other. During the transient period of time the output voltage ramps up or down depending on whether the input has increased or decreased and depending on the configuration of the operational amplifier as an inverting amplifier or a non-inverting amplifier. The rate of change of the output voltage is referred to as the slew rate and is a function of various components within the operational amplifier such as compensation capacitors.

SUMMARY

In one example, an operational amplifier includes a differential input pair of transistors configured to receive a first input voltage and a second input voltage and a slew boost circuit coupled to the differential input pair of transistors and configured to selectively increase current through the differential input pair of transistors. The operational amplifier also includes an output stage coupled to the differential input pair of transistors and configured to generate an output voltage, and a slew boost disable circuit configured to assert a control signal to the slew boost circuit to disable the slew boost circuit. The slew boost circuit is disabled when both: the first input voltage being more than a first threshold voltage different from the second input voltage and the output voltage failing to change by more than a second threshold voltage within a third threshold period of time.

In another example, a circuit includes a first transistor configured to receive a first input voltage, a second transistor configured to receive a second input voltage, a third transistor coupled to the first transistor and to a first capacitor, and a fourth transistor coupled to the second transistor and to a second capacitor. The circuit also includes a fifth transistor coupled to the third and fourth transistors in an arrangement to form a first current mirror with the third transistor and a second current mirror with the fourth transistor. A third capacitor is coupled to a third current mirror. The third capacitor is configured to receive a third voltage. The third current mirror is coupled to the fifth transistor.

In yet another example, a circuit includes a differential input transistor pair configured to receive a first input voltage and a second input voltage, a current source coupled to the differential input transistor pair, first and second capacitors coupled to the differential input transistor pair, a first current mirror coupled to the first capacitor and to a first transistor of the differential input transistor pair, and a second current mirror coupled to the second capacitor and to a second transistor of the differential input transistor pair. The circuit also includes a third capacitor coupled to a third current mirror. The third capacitor is configured to receive a third voltage. A voltage on one of the first or second capacitors is configured to increase responsive to both (a) the first input voltage being more than a first threshold voltage different from the second input voltage, and (b) the third voltage failing to change by more than a second threshold rate.

BRIEF DESCRIPTION OF THE DRAWINGS

For a detailed description of various examples, reference will now be made to the accompanying drawings in which.

DETAILED DESCRIPTION

The disclosed embodiments are directed to circuits usable in an operational amplifier. The disclosed operational amplifier includes a slew boost circuit that increases the current through the input stage of the operational amplifier to thereby increase the slew rate of the output voltage of the operational amplifier. The slew boost circuit detects a voltage difference across the inputs to the operational amplifier. In response, the slew boost circuit increases the current flow through an input differential transistor pair of the operational amplifier with larger potential differences across the inputs. In other embodiment, the slew boost circuit may detect a voltage difference of more than a threshold voltage across the inputs to the operational amplifier (indicative of step voltage change in one of the inputs) and, in response, increases the current flow through the input differential transistor pair of the operational amplifier.

However, it is possible that the input voltage to the operational amplifier is forced to be large enough that due to the gain of the operational amplifier, the output hits the power rail. The output voltage from the operational amplifier cannot exceed the power rail and thus will be stuck at, or approximately at, the power rail. In that state, a voltage difference between the input terminals of the operational amplifier will persist as the feedback voltage derived from the output voltage (and provided to an input terminal of the operational amplifier) is not permitted to match the input voltage on the other input terminal of the operational amplifier. The slew boost circuit will continue to provide for an increased current flow through the input stage of the operational amplifier because the voltages on the input terminals are different, but the slew boost circuit provides no added benefit in terms of increasing the slew rate. To avoid excessive current draw by the slew rate boost circuit in this state, the disclosed embodiments include a slew boost disable circuit that detects this condition and disables the slew boost circuit.

Figure 1:
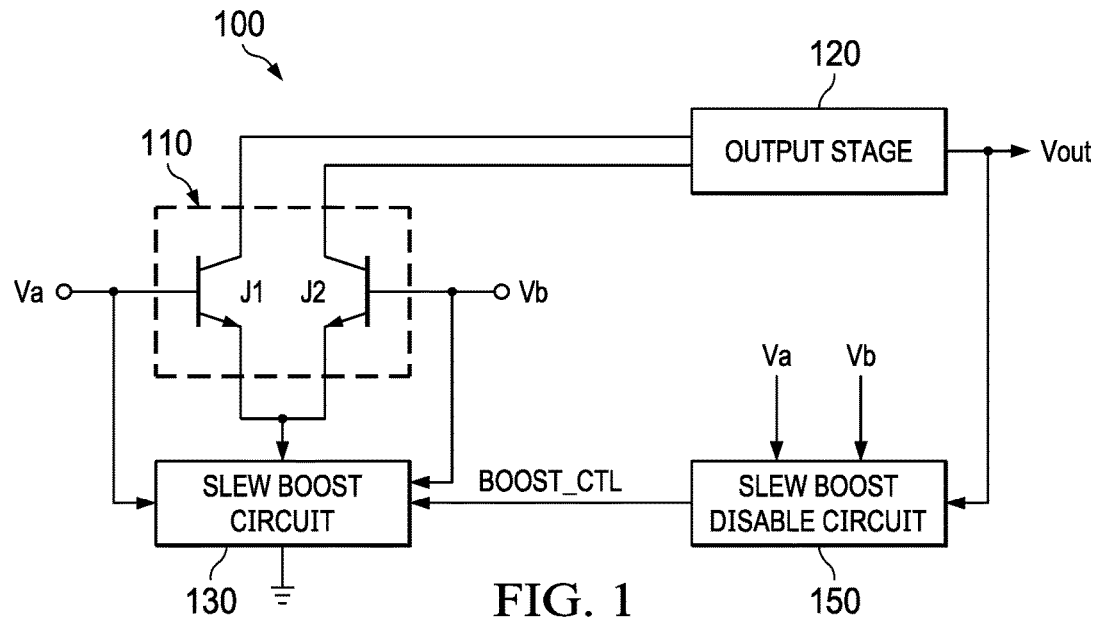
FIG. 1 illustrates an operational amplifier including a slew boost circuit and a slew boost disable circuit in accordance with an example.

FIG. 1 shows an example of an operational amplifier 100 in accordance with an embodiment. The operational amplifier 100 includes a differential input pair of transistors 110, an output stage 120, a slew boost circuit 130, and a slew boost disable circuit 150. The differential input pair of transistors 110 comprises NPN transistors J1 and J2, although other transistor types can be used as well (e.g., metal oxide semiconductor (MOS) devices). The control input (base) of J1 receives a first input voltage (Va), and the control input of J2 receives a second input voltage Vb). Va and Vb may comprise the "+" and "−" inputs to the operational amplifier 100. The output stage 120 is coupled to the differential input pair of transistors 110. The output stage 120 may comprise additional transistors and other components and produces an output voltage Vout.

The slew boost circuit 130 is coupled to the differential input pair of transistors 110 and, in one example, causes current through J1 and J2 to increase in the event that Va is more than a first threshold voltage different from Vb, regardless of whether Va is greater than or less than Vb. If Va is not more than the first threshold voltage different from Vb (i.e., Va is approximately equal to Vb), then the slew boost circuit 130 in this example does not increase the current through the differential input transistor pair 110 and the current through the differential input transistor pair 110 remains at a lower, quiescent level.

The slew boost disable circuit 150 asserts a BOOST_CTL control signal to the slew boost circuit 130 to disable the slew boost circuit 130 upon detecting that both (a) Va is more than the threshold voltage different from Vb and (b) the output voltage Vout is not slewing (e.g., Vout is failing to change by more than a second threshold rate). In one example, Vout is determined not to be slewing if the rate of change of Vout with respect to time is less than approximately 5V per microsecond. If the slew boost disable circuit 150 detects that Vout is not slewing despite Va being more than the first threshold voltage different than Vb, then the output voltage Vout has likely reached a power rail and cannot change any further. The slew boost disable circuit 150 responds by disabling the slew boost circuit 130.

Figure 2:
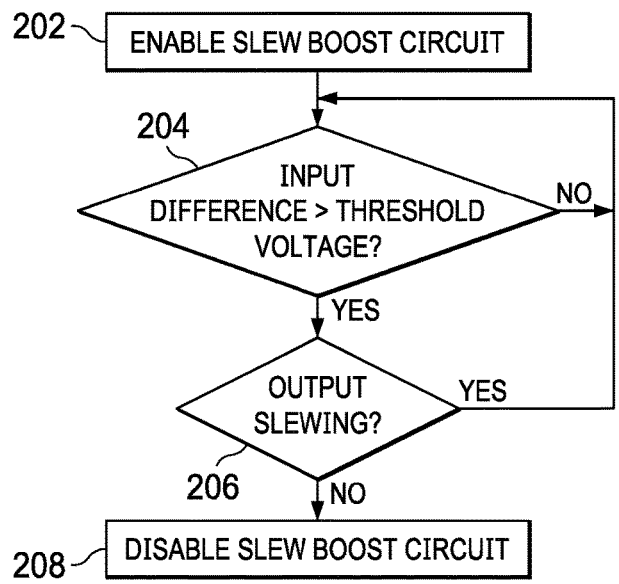
FIG. 2 shows a method of disabling the slew boost circuit of FIG. 1.

FIG. 2 shows an example of a method for controlling the slew boost circuit 130 in accordance with an example. At 202, the slew boost circuit is enabled. This operation may be performed by setting the state of the BOOST_CTL control signal to a low (or high) signal level. At 204, the method includes determining whether the difference between Va and Vb is more than a threshold voltage different from Vb (e.g., the first threshold voltage noted above). If Va is not more than the threshold voltage different from Vb, then control loops back to 204. If, however, Va is more than the threshold voltage different from Vb, then at 206, the method includes determining whether the output voltage Vout is slewing. This operation may include determining whether the rate of change of Vout with respect to time is less than a threshold rate (e.g., 5V per microsecond) which indicates an absence of slewing or more than the threshold which indicates the presence of slewing.

If the output is not slewing, then at 208, the slew boost circuit 130 is disabled (e.g., by changing the state of the BOOST_CTL control signal to a logic high (or low) signal level. If the output is slewing (the "yes" branch from 206), then the slew boost circuit 130 is not disabled and control loops back to 204. In some embodiments, the BOOST_CTL signal may comprise a current configured to be at one of two levels to cause the slew boost circuit 130 to be enabled or disabled. In other embodiments, the BOOST_CTL signal is a voltage that specifies whether the slew boost circuit 130 is to be enabled or disabled. In some examples, the BOOST_CTL signal comprises two distinct currents.

Figure 3:
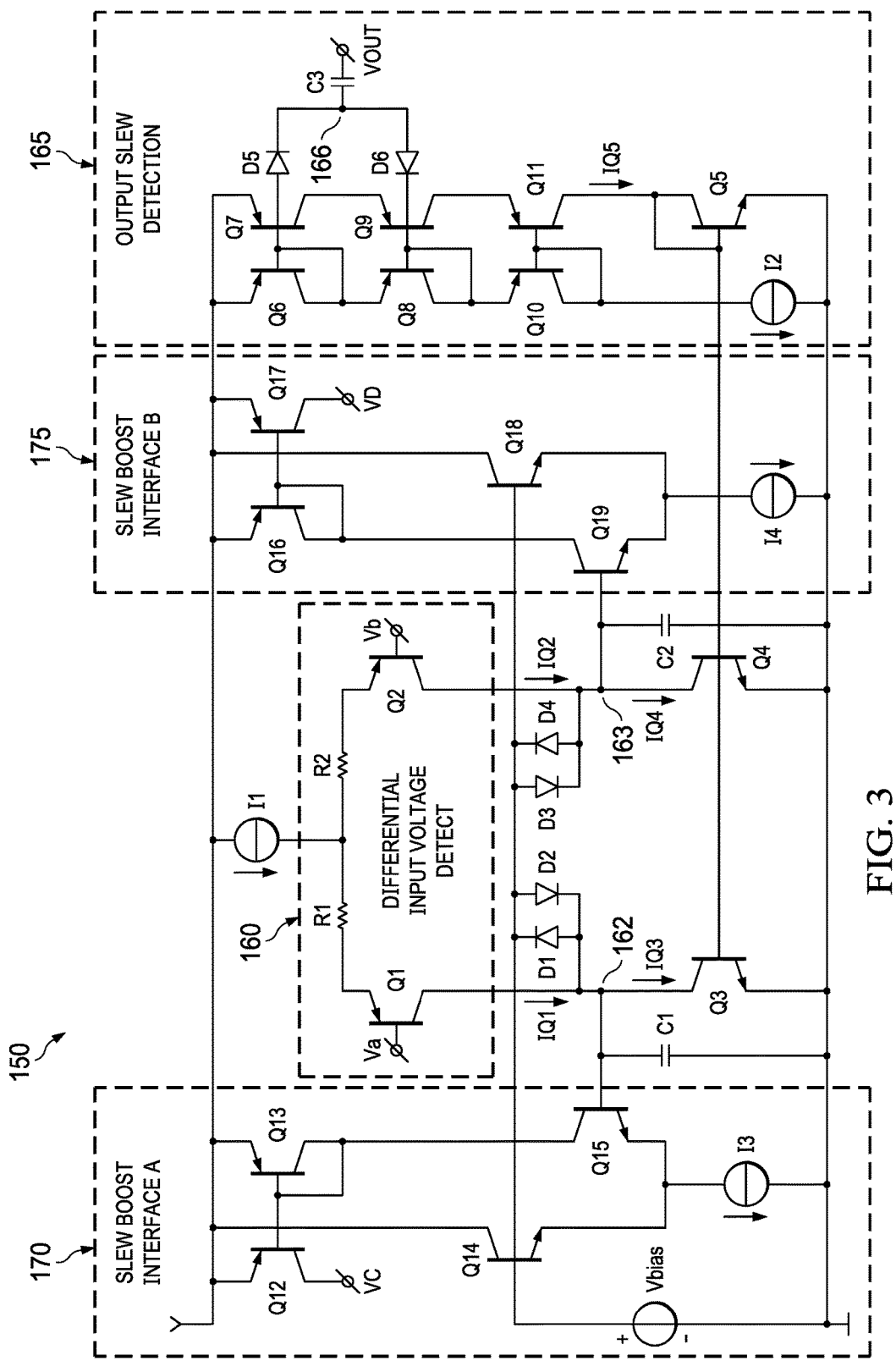
FIG. 3 shows a circuit implementation of the slew boost disable circuit of FIG. 2 in accordance with an example.

FIG. 3 shows an example of the slew boost disable circuit 150. The illustrative slew boost disable circuit 150 includes a differential input voltage detect circuit 160, an output slew detection circuit 165, a slew boost interface A circuit 170, and a slew boost interface B circuit 175. The differential input voltage detect circuit 160 includes resistors R1 and R2, and transistors Q1 and Q2. The output slew detection circuit 165 includes transistors Q5-Q11, diodes D5 and D6, and capacitor C3. Slew boost interface A circuit 170 includes transistors Q12-Q15, current source I3, and bias voltage Vbias. Slew boost interface B circuit 175 includes transistors Q16-Q19 and current source I4. Further, the slew boost disable circuit 150 includes current source I1, diodes D1-D4, capacitors C1 and C2, and transistors Q3 and Q4. The transistors shown in the example of FIG. 3 comprise bipolar junction transistors but may include other transistor types if desired, such as metal oxide semiconductor field effect transistors (MOSFETs). References herein to any of the current sources "Ix" refer to either the current source device or the current level produced by the current source. For example, I1 may refer to the current source device or to the current I1 produced by the current source.

The differential input voltage detect circuit 160 comprises Q1 and Q2 coupled together in a differential arrangement. Q1 and Q2 comprise PNP transistors in this example. Each of Q1 and Q2 includes a control input (e.g., the base of the transistors). The control input of Q1 receives the input voltage Va, and the control input of Q2 receives the input voltage Vb. Resistor R1 couples to the emitter of Q1 and resistor R2 couples to the emitter of Q2. When Va is approximately equal to Vb, the current from current source I1 generally divides approximately evenly between one current path comprising R1 and Q1 and another current path comprising R2 and Q2.

The current division between Q1 and Q2 is an approximately linear function of the differential input voltage Va-Vb. The threshold noted in block 204 of FIG. 2 is implemented in the example of FIG. 3 by the sizing of current IQ1 (current through Q1) versus the quiescent currents IQ3 (current through Q3) and IQ4 (current through Q4, which depends on IQ2 (current through Q2)). IQ3 and IQ4 are sized to be approximately ¾ of I1. This means that (Va-Vb) must be large enough to steer at least 75% of I1 to one side (Q3 or Q4), instead of approximately evenly dividing I1 between Q1 and Q2 when Va approximately equals Vb. In one example, this condition (¾ of I1 is steered through one of Q3 or Q4) is reached for a differential input voltage of about 120 mV.

The collector of Q1 couples to the collector of Q3 and the collector of Q2 couples to the collector of Q4. The bases of transistors Q3, Q4, and Q5 are connected together with the base and collector of Q5 connected together as shown. In this arrangement, transistors Q3 and Q5 form one current mirror and transistors Q4 and Q5 form another current mirror. These two current mirrors share transistor Q5.

Diodes D1 and D2 are connected between the collector of Q3 and the bases of Q14 and Q18, with the anode of diode D1 and the cathode of diode D2 coupled to the collector of Q3, and the cathode of D1 and the anode of D2 coupled to the bases of Q14 and Q18. Similarly, diodes D3 and D4 are connected between the collector of Q4 and the bases of Q14 and Q18, with the anode of diode D4 and the cathode of diode D3 coupled to the collector of Q4, and the cathode of D4 and the anode of D3 coupled to the bases of Q14 and Q18. The collector of Q3 is coupled to capacitor C1 at node 162 and the collector of Q4 is coupled to capacitor C2 at node 163. Diodes D1-D4 ensure that the voltages at the collectors of Q3 and Q4 stay within one turn-on voltage of a diode (approximately 0.7V) from voltage Vbias.

As noted above, responsive to Va being approximately equal to Vb, the current from current source I1 divides approximately evenly between Q1 and Q2. Thus, approximately ½*I1 current flows through Q1 and approximately ½*I1 current flows through Q2. As will be explained below, the collector-to-emitter current through Q3 and Q4 is configured to be at a first level or at a second level with the second level being greater than the first level. The lower first level of current through Q3 is higher than the current through Q1 and Q2 (e.g., ½*I1) when Va is approximately equal to Vb. In that case, the current into node 162 from Q1 (IQ1) is less than the current through Q3 (IQ3), which causes capacitor C1 to discharge current into Q3 until the voltage at node 162 is approximately 0.7V below Vbias, which causes additional current to flow from diode D2. Consequently, the voltage on capacitor C1 at node 162 remains low. Similarly, the current through Q4 (IQ4) is the same as the current through Q3 (IQ3). As such, the current from Q2 (IQ2) is less than IQ4 and capacitor C2 discharges current into Q4 resulting in capacitor C2 discharging until the voltage on the capacitor at node 163 is approximately 0.7V below Vbias, which causes additional current to flow from diode D3. That both voltages on capacitors C1 and C2 at nodes 162 and 163, respectively, are low indicates that either Va is approximately equal to Vb or, if Va is not approximately equal to Vb, Vout is changing (i.e., slewing).

Referring to the output slew detection circuit 165, capacitor C3 receives the output voltage Vout on one of its plates. The other plate of C3 (node 166) couples to the cathode of diode D5 and to the anode of diode D6. Transistors Q6 and Q7 are configured as a current mirror. Transistors Q8 and Q9 and transistors Q10 and Q11 comprise cascode configurations. Thus, the output slew detection circuit 165 includes a multiple current mirror, cascode transistors, as well as Q5 which itself forms a current mirror in conjunction with Q3 and with Q4 as explained above.

Current source I2 is coupled to Q10. With Q6, Q8, and Q10 coupled together, the current through Q6, Q8, and Q10 is I2. Similarly, with Q7, Q9 and Q11 coupled together, the mirrored current flows through Q7, Q9, Q11 and Q5. For example, if the transistors are sized similarly, then the current through Q5 (IQ5) is approximately equal to I2. The transistors, however, may be sized differently in some embodiments, and thus IQ5 may be a scaled version of I2. In any case, I2 is set so that IQ5 is between ½*I1 and I1 (e.g., set to ¾*I1) when Vout is not slewing.

If Vout increases or decreases relative to the voltage on node 166, then C3 will either discharge current through diode D6 (when Vout increases above the voltage on node 166) or receive charging current through diode D5 (when Vout decreases below the voltage on node 166). In the case in which Vout increases, current from C3 flows through D6 and is added to the mirrored current flowing through Q11. This extra current also flows through Q5 and thus IQ5 increases to a level greater than ¾*I1. In one example, the current flowing through Q5 is greater than I1 (e.g., 1.5*I1) when Vout changes. Similarly, if Vout decreases below the voltage on node 166, current flows through diode D5 and the voltage on the base of Q7 is pulled down due to the current flowing through diode D5. As a result, Q7 is caused to open even more, which causes more collector current to flow through Q7. As a result, the current flowing through Q7, Q9 and Q11 increases and thus current to Q5 also increases. Regardless of whether Vout increases or decreases relative to the voltage on node 166, additional current is forced to flow through Q5. Due to the increase of IQ5, both IQ3 and IQ4 increase. As such, the level of current through Q3 and Q4 when Vout is slewing is greater than the level of current through Q3 and Q4 when Vout is not slewing.

If Va increases relative to Vb, Q1 closes thereby forcing all of I1 to flow through Q2. Similarly, if Vb increases relative to Va, Q2 closes thereby forcing all of I1 to flow through Q1. Thus, when Va and Vb are not approximately equal, most or all of I1 flows through one of Q1 or Q2. If IQ3 and IQ4 increase to a level greater than I1 (due to Vout changing as explained above), then whichever of IQ1 or IQ2 equals the full level of I1, that current is still less than IQ4 or IQ5 and capacitors C1 and C2 are still discharged to maintain the voltage on the capacitors C1 and C2 at a low level when Vout is slewing.

If Vout is not slewing, then IQ3 and IQ4 remain at the level between ½*I1 and I1 (e.g., ¾*I1). That current level is less than I1, and I1 current will flow through either of Q1 or Q2 depending on which of Va or Vb has risen above the other of Va or Vb. If, for example, IQ1 equals I1, then with IQ3 being less than I1, some of current I1 flows to capacitor C1 and causes capacitor C1 to charge thereby increasing its voltage. The same response occurs to charge capacitor C2 if IQ2 equals I1 and Vout is not slewing. Thus, with Vout not slewing, C1 is charged responsive to Vb being greater than Va, while C2 is charged responsive to Va being greater than Vb.

In operation, the output slew detection circuit 165 detects whether Vout is slewing and causes a current of, for example, approximately ¾*I1 to flow through Q3 and Q4 when Vout is not detected as slewing. Vout will not slew if (a) neither Va nor Vb is changing and Vout need not change due to a lack of change in Va or Vb or (b), Vout has slewed but has reached a power rail (at or near the maximum power supply voltage provided to the operational amplifier 100) and cannot change any more. If the output slew detection circuit 165 detects that Vout is not slewing, then the current mirror comprising Q3 and Q5 and the current mirror comprising Q4 and Q5 cause IQ3 and IQ4 to be approximately ¾*I1. If, however, Vout is slewing, IQ3 and IQ4 are increased to ensure that they are greater than I1, which will cause capacitors C1 and C2 to discharge themselves.

In one embodiment, the voltages on C1 and C2 may represent the BOOST_CTL control signal of the example of FIG. 1. The example of FIG. 3 includes slew boot interface A circuit 170 and slew boost interface B circuit 175 to convert the voltages on the capacitors C1 and C2 to signaling suitable to enable or disable the slew boost circuit 130 implemented in the operational amplifier 100. The circuitry of slew boot interface circuit A 170 and slew boost interface circuit B 175 is specific to the particular slew boost circuit 130 used and thus can be implemented differently for various implementations of slew boost circuits.

Vbias is coupled to the bases of Q14 and Q18. With respect to slew boost interface B circuit 175, Q18 and Q19 form a differential pair of transistors. When C2 is discharged, the base-to-emitter voltage Vbe of Q19 will be less than the Vbe of Q18 by the on-voltage of D3 (approximately 0.7V). With Vbe of Q19 being lower than the Vbe of Q18 (by about 0.7V), Q19 will be off and all of I4 flows through Q18, which is on. If, however, the voltage on C2 increases as explained above (due to Vout reaching a power rail while Va is not approximately equal to Vb), the Vbe of Q18 increases thereby turning on Q19, which causes the Vbe of Q18 to decrease thereby turning off Q18. The voltage on C2 will not exceed a diode voltage above Vbias due to the on-voltage of diode D4. As a result, the entire I4 either flows through Q18 when C2 is discharged, or through Q19 when C2 is charged. Q16 and Q17 form a current mirror and creates a current through Q17 that is a copy of the current through Q16. The current through Q16 (and thus through Q17) is either zero if Q19 is off (when C2 is discharged) or I4 (when C2 is charged). The current through Q17 can be used to enable or disable the current boost circuit 130. For example, the current through Q17 being low/off enables the current boost circuit 130, and the current through Q17 being high/I4 disables the current boost circuit 130. The configuration and operation of the slew boost interface A circuit 170 is similar to that of the slew boost interface B circuit 175, with diodes D1 and D2 used to clamp the voltage on the base of Q15 relative to Vbias.

In the example of FIG. 3, the slew boost interface circuits A and B 170, 175 are shown as part of the slew boost disable circuit 150. In other embodiments, slew boost interface circuits A and B 170, 175 are part of the slew boost circuit 130 itself.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. As used herein, approximately means "within 10%." For example, if one value is approximately the same as another value, then one value is within 10% of the other value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An operational amplifier, comprising:
    an input stage configured to receive a first input voltage and a second input voltage;
    a slew boost circuit coupled to the input stage and configured to selectively increase current through the input stage;
    an output stage coupled to the input stage and configured to generate an output voltage; and
    a slew boost disable circuit configured to assert a control signal to the slew boost circuit to disable the slew boost circuit responsive to both:
        the first input voltage being more than a first threshold voltage different from the second input voltage; and
        the output voltage failing to change with respect to time by more than a second threshold rate.

2. The operational amplifier of claim 1, wherein the slew boost disable circuit comprises:
    a first capacitor that is charged responsive to the second input voltage being more than the first threshold voltage greater than the first input voltage; and
    a second capacitor that is charged responsive to the first input voltage being more than the first threshold voltage greater than the second input voltage.

3. The operational amplifier of claim 2, wherein the control signal is asserted based on a voltage of either of the first or second capacitors.

4. The operational amplifier of claim 2, wherein the input stage comprises:
    a first transistor coupled to the first capacitor and to a current source, wherein the first transistor includes a control input configured to receive the first input voltage; and
    a second transistor coupled to the second capacitor and to the current source, wherein the second transistor includes a control input configured to receive the second input voltage.

5. The operational amplifier of claim 4, further comprising:
    a first current mirror including a third transistor, wherein the first current mirror is coupled to the first transistor and to the first capacitor; and
    a second current mirror including a fourth transistor, wherein the second current mirror is coupled to the second transistor and to the second capacitor;
    wherein, based on the rate of change of the output voltage respect to time, the first current mirror causes a current to flow through the third transistor; and
    wherein, based on the rate of change of the output voltage respect to time, the second current mirror causes a current to flow through the fourth transistor.

6. The operational amplifier of claim 5, wherein the current that flows through the third transistor is greater when the rate of change of the output voltage is larger than if the rate of change of the output voltage is smaller.

7. The operational amplifier of claim 6, wherein the current that flows through the fourth transistor is greater when the rate of change of the output voltage is larger than if the rate of change of the output voltage is smaller.

8. The operational amplifier of claim 5, wherein the slew boost disable circuit comprises:
    a third current mirror;
    a first diode coupled to the third current mirror;
    a cascode transistor;
    a second diode coupled to the cascode transistor; and
    a third capacitor coupled to the first and second diodes and to the output voltage;
    wherein the first and second current mirrors share a fifth transistor, and wherein the fifth transistor is coupled to the cascode transistor.

9. The operational amplifier of claim 5, wherein the first, second, third, and fourth transistors comprise bipolar junction transistors.

10. A circuit, comprising:
    a first transistor configured to receive a first input voltage;
    a second transistor configured to receive a second input voltage;
    a third transistor coupled to the first transistor and to a first capacitor;
    a fourth transistor coupled to the second transistor and to a second capacitor;
    a fifth transistor coupled to the third and fourth transistors in an arrangement to form a first current mirror with the third transistor and a second current mirror with the fourth transistor; and
    a third capacitor coupled to a third current mirror, wherein the third capacitor is configured to receive a third voltage and the third current mirror is coupled to the fifth transistor.

11. The circuit of claim 10, further comprising a current source coupled to the first and second transistors.

12. The circuit of claim 11, wherein:
    responsive to the first input voltage being less than a first threshold voltage different from the second input voltage, current from the current source divides approximately evenly between the first transistor and the second transistor; and responsive to the first input voltage being greater than the first threshold voltage different from the second input voltage, at least 75% of the current from the current source flows through one of the first or second transistors.

13. The circuit of claim 10, wherein:
the first capacitor is configured to be charged responsive to the second input voltage being more than a first threshold voltage greater than the first input voltage; and
the second capacitor is configured to be charged responsive to the first input voltage being more than the first threshold voltage greater than the second input voltage.

14. The circuit of claim 10, wherein:
wherein the first current mirror is configured to cause a current at a first level to flow through the third transistor responsive to the third voltage failing to slew by more than a second threshold rate and to cause a current at a second level to flow through the third transistor responsive to the third voltage slewing by more than the second threshold rate; and
wherein the second current mirror is configured to cause a current at the first level to flow through the fourth transistor responsive to the third voltage failing to slew by more than the second threshold rate and to cause a current at the second level to flow through the fourth transistor responsive to the third voltage slewing by more than the second threshold rate.

15. The circuit of claim 10, wherein the second level is configured to be larger than the first level, and wherein the first level is configured to be greater than current that flows through the first transistor when the first input voltage is within the first threshold voltage of the second input voltage.

16. The circuit of claim 10, further comprising:
a first diode having an anode and a cathode, wherein the first diode is connected between the third current mirror and the third capacitor with the cathode of the first diode connected to the third capacitor; and
a second diode having an anode and a cathode, wherein the second diode is connected between a cascode transistor and the third capacitor with the anode of the second diode connected to the third capacitor.

17. A circuit, comprising:
a differential input transistor pair configured to receive a first input voltage and a second input voltage;
a current source coupled to the differential input transistor pair;
first and second capacitors coupled to the differential input transistor pair;
a first current mirror coupled to the first capacitor and to a first transistor of the differential input transistor pair;
a second current mirror coupled to the second capacitor and to a second transistor of the differential input transistor pair; and
a third capacitor coupled to a third current mirror, wherein the third capacitor is configured to receive a third voltage;
wherein the third current mirror is coupled to the first and second current mirrors; and
wherein a voltage on one of the first or second capacitors is configured to increase responsive to both:
the first input voltage being more than a first threshold voltage different from the second input voltage; and
the third voltage failing to change by more than a second threshold rate.

18. The circuit of claim 17, wherein the first and second current mirrors share a transistor.

19. The circuit of claim 17, further comprising a slew boost circuit configured to be disabled responsive to the voltage on one of the first or second capacitors having increased.

20. The circuit of claim 17, wherein the differential input transistor pair, the first current mirror, the second current mirror, and the third current mirror comprise bipolar junction transistors.

* * * * *